US009659941B2

(12) United States Patent
Anderson et al.

(10) Patent No.: US 9,659,941 B2
(45) Date of Patent: May 23, 2017

(54) INTEGRATED CIRCUIT STRUCTURE WITH METHODS OF ELECTRICALLY CONNECTING SAME

(71) Applicant: GLOBALFOUNDRIES INC., Grand Cayman (KY)

(72) Inventors: Brent A. Anderson, Jericho, VT (US); Edward J. Nowak, Shelburne, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/754,958

(22) Filed: Jun. 30, 2015

(65) Prior Publication Data

US 2017/0005101 A1    Jan. 5, 2017

(51) Int. Cl.
*H01L 27/11* (2006.01)
*H01L 21/28* (2006.01)
*H01L 29/417* (2006.01)
*H01L 27/12* (2006.01)
*H01L 29/45* (2006.01)

(52) U.S. Cl.
CPC .... *H01L 27/1104* (2013.01); *H01L 21/28008* (2013.01); *H01L 27/1211* (2013.01); *H01L 29/41791* (2013.01); *H01L 29/45* (2013.01)

(58) Field of Classification Search
CPC ............. H01L 27/1104; H01L 27/1211; H01L 21/28008; H01L 29/41791; H01L 29/45
USPC .......................................... 257/351; 438/586
See application file for complete search history.

(56) References Cited

U.S. PATENT DOCUMENTS

| 5,818,080 | A  | 10/1998 | Kuriyama |
| 6,033,957 | A  | 3/2000  | Burns, Jr. et al. |
| 6,140,684 | A  | 10/2000 | Chan et al. |
| 6,477,080 | B2 | 11/2002 | Noble |
| 6,759,699 | B1 | 7/2004  | Chi |
| 7,138,685 | B2 | 11/2006 | Hsu et al. |
| 7,683,428 | B2 | 3/2010  | Chidambarrao et al. |

(Continued)

OTHER PUBLICATIONS

B. A. Anderson et al., "Semiconductor structures with pair(s) of vertical field effect transistors, each pair having a shared source/drain region and methods of forming the structures," U.S. Appl. No. 14/169,318, filed Jan. 31, 2014, 60 pages.

*Primary Examiner* — Cuong Q Nguyen
*Assistant Examiner* — Tong-Ho Kim
(74) *Attorney, Agent, or Firm* — Anthony Canale; Hoffman Warnick LLC

(57) ABSTRACT

Embodiments of the present disclosure provide an integrated circuit (IC) structure and methods of electrically connecting multiple IC structures. An IC structure according to embodiments of the present disclosure can include: a first conductive region; a second conductive region laterally separated from the first conductive region; a first vertically-oriented semiconductor fin formed over and contacting the first conductive region; a second vertically-oriented semiconductor fin formed over and contacting the second conductive region; and a first gate contacting each of the first vertically-oriented semiconductor fin and the second conductive region, wherein the first gate includes: a substantially horizontal section contacting the first vertically-oriented semiconductor fin, and a substantially vertical section contacting the second conductive region.

19 Claims, 6 Drawing Sheets

(56) References Cited

U.S. PATENT DOCUMENTS

| | | |
|---|---|---|
| 8,373,235 B2 | 2/2013 | Masuoka et al. |
| 2006/0202361 A1* | 9/2006 | Liaw ........................ H01L 21/84 257/427 |
| 2012/0168838 A1* | 7/2012 | Marukame .............. H01L 21/84 257/295 |
| 2014/0138773 A1 | 5/2014 | Cheng et al. |
| 2014/0153321 A1* | 6/2014 | Liaw ..................... G11C 11/412 365/154 |

* cited by examiner

INTEGRATED CIRCUIT STRUCTURE WITH METHODS OF ELECTRICALLY CONNECTING SAME

BACKGROUND

The disclosure relates generally to integrated circuit (IC) structures, including static random access memory (SRAM) structures, in addition to processes for electrically connecting two or more IC structures. Processes according to the present disclosure can form embodiments of the IC structures described herein.

In integrated circuit (IC) structures, a transistor is a critical component for implementing digital circuitry designs. Generally, a transistor includes three electrical terminals: a source, a drain, and a gate. By applying different voltages to the gate terminal, the flow of electric current between the source and the drain can be turned on and off. A common type of transistor is a metal oxide field effect transistor (MOSFET). One type of MOSFET structure is a "FinFET," typically formed upon a semiconductor-on-insulator (SOI) layer and buried insulator layer. A FinFET can include a semiconductor structure etched into a "fin" shaped body, with one side of the fin acting as a source terminal and the other side of the fin acting as a drain terminal. A gate structure, which may be at least partially conductive, can be formed around one or more of the semiconductor fins. By applying a voltage to the gate structure, an electrically conductive channel can be created between the source and drain terminals of each fin in contact with the gate. In some IC structures, it may be desirable to orient one or more FinFETs in a vertical direction, i.e., substantially perpendicular to the plane of a substrate material, such that the gate of the FinFET intersects with the fin in a horizontal plane.

Several transistors, including FinFET transistors, can be electrically connected to each other to provide fundamental elements of a digital circuit's architecture. One type of digital circuit element is random access memory (RAM), which can be provided as either "static RAM" (SRAM) or "dynamic RAM" (DRAM). An SRAM cell typically includes six transistors, four of which can be wired to form two cross-coupled voltage inverters for storing binary digits (also known as "bits") in the form of "high" and "low" voltages, i.e., voltages above or below a predetermined threshold. The remaining two transistors in an SRAM structure can be known as "access transistors," so named because these transistors can control electrical access to the SRAM cell during read and write operations. Reducing the size of memory components in an IC, including SRAM cells, can allow more bits to be stored on one product and thereby reduce manufacturing costs per bit of storage.

BRIEF SUMMARY

A first aspect of the disclosure provides an integrated circuit (IC) structure including: a first conductive region; a second conductive region laterally separated from the first conductive region; a first vertically-oriented semiconductor fin formed over and contacting the first conductive region; a second vertically-oriented semiconductor fin formed over and contacting the second conductive region; and a first gate contacting each of the first vertically-oriented semiconductor fin and the second conductive region, wherein the first gate includes: a substantially horizontal section contacting the first vertically-oriented semiconductor fin, and a substantially vertical section contacting the second conductive region.

A second aspect of the present disclosure provides an integrated circuit (IC) structure including: a first conductive region; a second conductive region laterally separated from the first conductive region; a first vertically-oriented semiconductor fin formed over and contacting the first conductive region; a second vertically-oriented semiconductor fin formed over and contacting the second conductive region; and a first gate contacting the first vertically-oriented semiconductor fin; and a first contact positioned over the second conductive region and extending vertically through each of the insulator and the first gate, wherein the first contact electrically connects the first gate to the second conductive region.

A third aspect of the disclosure provides a method of forming an electrical connection, including: providing an IC structure including: a first conductive region, a second conductive region laterally separated from the first conductive region, a first semiconductor fin positioned substantially vertically over the first conductive region, a second semiconductor fin positioned over a first portion of the second conductive region, an insulator positioned at least over a second portion of the second conductive region, and a gate dielectric positioned over the insulator, the first semiconductor fin, and the second semiconductor fin; removing a portion of the insulator and the gate dielectric positioned over the second portion of the second conductive region to expose the second portion of the second conductive region; forming a first gate region over the gate dielectric and the exposed second portion of the second conductive region, to electrically connect the IC structure to the second semiconductor fin.

A fourth aspect of the disclosure provides a method of forming an electrical connection, including: providing an IC structure including: a first conductive region, a second conductive region laterally separated from the first conductive region, a first semiconductor fin positioned substantially vertically over the first conductive region, a second semiconductor fin positioned over a first portion of the second conductive region, an insulator positioned at least over a second portion of the second conductive region, and a gate electrically connected to the first semiconductor fin and positioned vertically over the second conductive region; removing a portion of the gate and the insulator to form a trench and expose the second portion of the second conductive region; and forming a contact in the trench, over the exposed portion of the conductive region, to electrically connect the gate to the second conductive region through the contact, wherein the contact extends substantially vertically through the gate.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION

Embodiments of the present disclosure provide an IC structure for providing reduced size and scale of electrical components, in addition to process methodologies for fabricating the IC structures described herein. In an example application, IC structures according to the present disclosure can be fabricated and/or combined with other components and each other to form, e.g., the structure of a static random access memory (SRAM) cell of a digital circuit. An integrated circuit structure according to the present disclosure can include a first conductive region with one or more semiconductor fins (e.g., three semiconductor fins) positioned over and contacting the first conductive region. At least one gate, positioned over a second conductive region and partially over the first conductive region, can include a substantially vertical section which directly electrically connects the gate to the first conductive region. One or more other vertically separated gates can be electrically to the conductive region through a semiconductor fin. Where multiple gates are provided, each gate can be laterally separated from each of the others, e.g., a layer of electrically insulating material such as an electrically insulative dielectric material.

Figure 1:
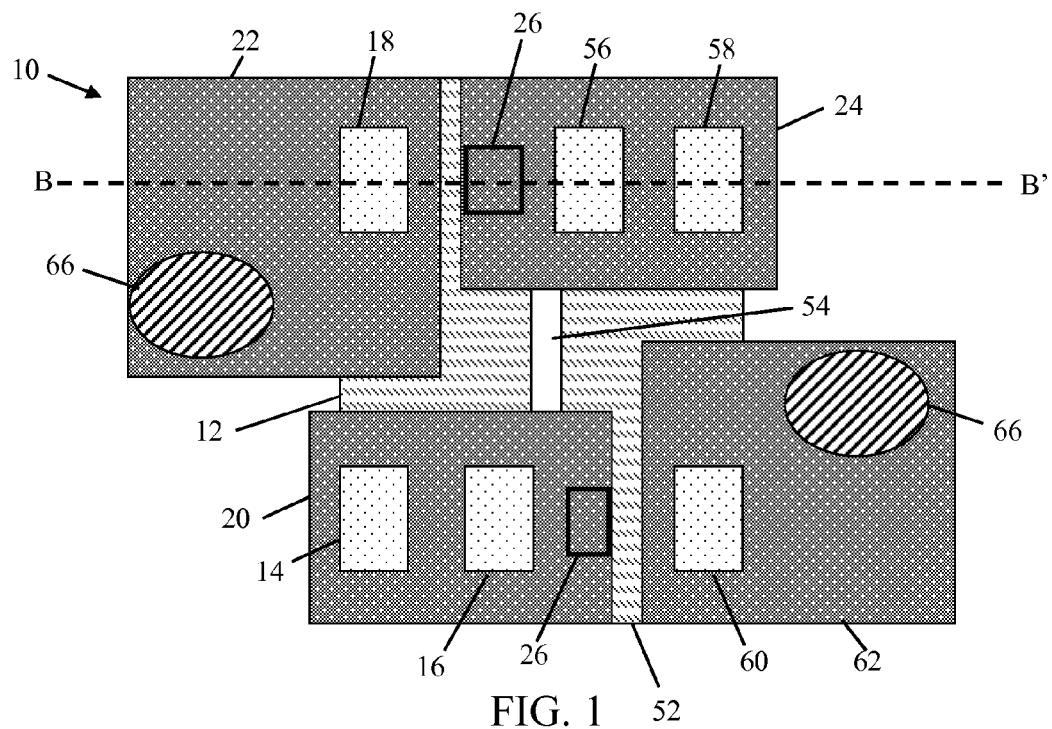
FIG. 1 shows a plan view of an IC structure according to embodiments of the present disclosure.

Referring to FIG. 1, a plan view of an IC structure 10 according to aspects of the present disclosure is shown. IC structure 10 can be fabricated at least partially using process steps described in detail elsewhere herein, conventional fabrication techniques, and/or combinations thereof. IC structure 10 can include a first conductive region 12 in the form of, e.g., an intermediate semiconductor wafer structure from which one or more transistors can be fabricated. First conductive region 12 of IC structure 10 can be composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of first conductive region 12 or a portion thereof may be strained. To provide electrical conductivity, between components discussed herein, first conductive region 12 can include dopant materials therein (e.g., p-type or n-type dopants) or can be composed of a conductive silicide material.

First conductive region 12 can be electrically connected to a first group of semiconductor fins positioned over and contacting first conductive region 12. The first plurality of semiconductor fins can include a first semiconductor fin 14, a second semiconductor fin 16, and a third semiconductor fin 18. It is also understood that only one semiconductor fin, e.g., first semiconductor fin 14, can be positioned over first conductive region 12 in alternative embodiments. Each semiconductor fin 14, 16, 18 in the first plurality can be composed of any currently known or later developed semiconductor material, and may be free of dopants therein. First and second semiconductor fins 14, 16 can be electrically connected to a first gate 20 vertically displaced from (e.g., positioned vertically above or below) a horizontal surface of first conductive region 12. First gate 20 can be in the form of any currently known or later developed conductive material such as, e.g., aluminum (Al), zinc (Zn), indium (In), copper (Cu), indium copper (InCu), tin (Sn), tantalum (Ta), tantalum nitride (TaN), tantalum carbide (TaC) titanium (Ti), titanium nitride (TiN), titanium carbide (TiC), tungsten (W), tungsten nitride (WN), tungsten carbide (WC), and/or polysilicon (poly-Si) or combinations thereof. First gate 20 can optionally include a portion of gate dielectric material over first and/or second semiconductor fin(s) 14, 16. A gate dielectric material of first gate 20 can include silicon oxide ($SiO_2$), hafnium oxide ($HfO_2$), zirconium silicate ($ZrSiO_4$), and/or other types of dielectric materials described herein.

Initially, semiconductor fins 14, 16, 18 can be formed as a single layer of semiconductive material which is later processed into individual components, shown in FIG. 1 as first, second, and third semiconductor fins 14, 16, 18. For example, first, second, and third semiconductor fins 14, 16, 18, may be remaining portions of a single semiconductor-on-insulator (SOI) substrate composed of a layer of semiconductor material bonded to and positioned over first conductive region 12 and/or a layer of insulating material. Although three semiconductor fins 14, 16, 18, are shown by example in FIG. 1, it is understood that processes according to the present disclosure can use any conceivable number of semiconductor fins 14, 16, 18. An example process by which semiconductor fins 14, 16, 18 and/or first conductive region 12 can be formed, e.g., as part of an SOI substrate, is wafer bonding. "Wafer bonding" generally refers to a process in which two semiconductor wafers are bonded together, forming a single substrate material. The bonded semiconductor wafers can be cut using any currently known or later developed semiconductor or SOI fabrication process. As one example, a semiconductor material can be formed by implanting a bonded wafer with hydrogen and then annealing the wafer, causing it to split along the plane of the implanted hydrogen. Semiconductor fins 14, 16, 18 can be composed of, for example, silicon or another semiconductor material, and optionally may have the same material composition as first conductive region 12. In addition, each semiconductor fin 14, 16, 18, can be substantially vertically oriented relative to first conductive region 12. In an example embodiment, a vertical length to horizontal length aspect ratio of one or more semiconductor fins 14, 16, 18, can be, e.g., at least approximately two-to-one.

IC structure 10 can optionally include a second gate 22 electrically connected to third semiconductor fin 18, and a third gate 24 positioned at least partially over first conductive region 12. Second and third gates 22, 24, can be composed of the same material as first gate 20 or can be composed of any other type of gate material, including metal and/or dielectric portions, described herein. First gate 20, second gate 22, and third gate 24 can be laterally separated from each other such that each gate 20, 22, 24 is electrically connected to other gates and elements discussed herein through semiconductor fins 14, 16, 18 and first conductive region 12. Third gate 24 can include a vertical section 26 which directly electrically connects gate 24 to first conductive region 12. In addition or alternatively, first gate 20 can be positioned at least partially over another conductive region, and include vertical section 26 directly electrically connecting first gate 20 to another conductive region. During operation, the direct electrical connection between gates (e.g., first gate 20 and/or third gate 24) to adjacent conductive regions (e.g., first conductive region 12) can provide one or more cross-coupled inverter connections during operation, thereby allowing for IC structure 10 to be used as or within an SRAM cell.

Figure 2:
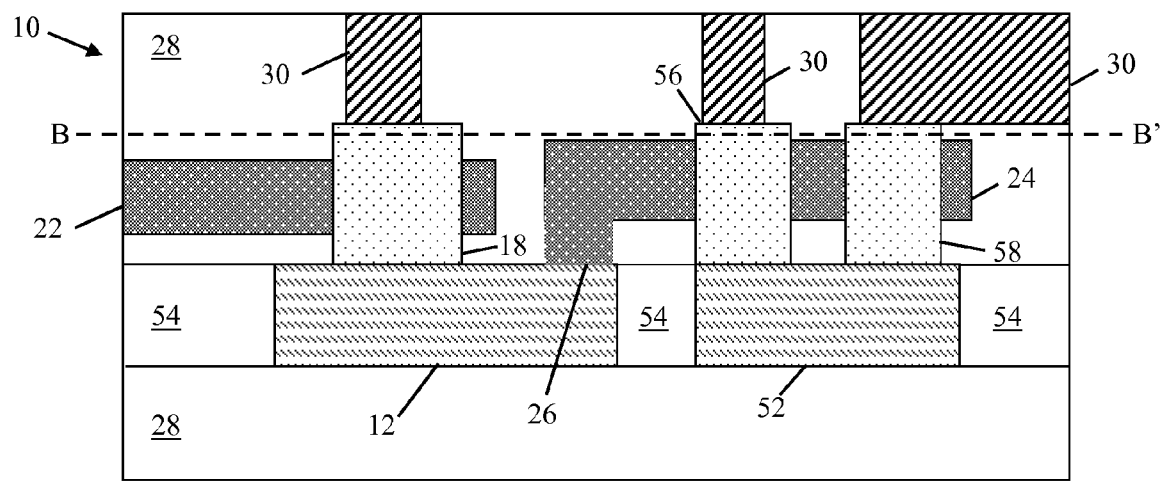
FIG. 2 shows a cross-sectional view along line A-A' of an IC structure according to embodiments of the present disclosure.

Turning to FIG. 2, a cross-sectional view of IC structure 10 along line A-A' of FIG. 1 is shown. An insulator 28 can be positioned between first gate 20 (FIG. 1), second gate 22, and third gate 24 to laterally separate and electrically insulate each gate from each other. Insulator 28 may be composed of any insulating material such as $SiO_2$ or a "high-k" dielectric having a high dielectric constant, which may be, for example, above 3.9. In some situations, insulator 28 may be composed of an oxide substance, and correspondingly may be referred to as a buried insulator or buried oxide (BOX) layer. Insulator 28 can initially be formed as a single, continuous layer, but can later be processed to include trenches, cavities, etc., as discussed herein. Materials appropriate for the composition of insulator 28 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties.

IC structure 10 can also include a contact 30 positioned over and in contact with third semiconductor fin 18, and/or first and second semiconductor fins 14, 16. Contacts 30 can be in the form of a conductive metal, doped semiconductor layer, and/or silicide material for providing an electrical connection. Each semiconductor fin 14, 16, 18 and their respective gate 20, 22 can together comprise field effect transistors (FETs) of a partial SRAM structure or complete SRAM cell, with other transistors and/or electrical connections being provided in other IC structures connected to IC structure 10, e.g., through vertical section 26 third gate 24, etc.

As discussed elsewhere herein, IC structure 10 can include a group of semiconductor fins including, e.g., three semiconductor fins 14 (FIG. 1), 16 (FIG. 1), 18. In alternative embodiments, semiconductor fins 14, 16, 18 can be formed by removing portions of insulator 28 and forming semiconductive material therein (e.g., by deposition). Although semiconductor fins 14, 16, 18 are shown by example as protruding substantially vertically from first conductive region 12, it is understood that embodiments of the present disclosure can be applied to semiconductor fins 14, 16, 18 which extend wholly or partially through insulator 28 in addition to contacting first conductive region 12, as shown in FIG. 2. As used herein, the term "substantial" or "substantially" in relation to a specified spatial relationship, quantifiable in terms of units such as distance, displacement, conductivity, etc., can include two or more values within ten percentage points (i.e., above or below) of each other and/or a specified numerical value or percentage, and/or all variances in placement which cause no substantial operational difference between the stated spatial relationship (e.g., vertical or horizontal alignment, parallel or perpendicular orientation) and the practiced spatial relationship. The terms "substantial" or "substantially" can also include other specific types of spatial relationships or ranges of spatial relationships where specified herein. Semiconductor fins 14, 16, 18, can be components of PFET and/or NFET transistors. A PFET transistor generally refers to a transistor with a p-type doped fin (i.e., source and drain regions), while an NFET transistor generally refers to a transistor with an n-type doped fin (i.e., source and drain regions). In a PFET, holes are responsible for conduction of electricity across the channel, while electrons are responsible for conduction of electricity across the channel in an NFET.

Referring to FIGS. 1 and 2 together, IC structure 10 can include a second conductive region 52 separated from first conductive region 12 and other semiconductor materials by a shallow trench isolation (STI) 54 positioned laterally between, e.g., first and second conductive regions 12, 52. STI(s) 54 can be formed by removing portions of first and/or second conductive regions 12, 52 to form trenches and then filling with trenches with an electrically insulative material, such as one or more of the materials discussed herein with respect to insulator 28. In an example embodiment, STI(s) 54 can include one or more oxide materials. To provide electrical conductivity through second conductive region 52, second conductive region 52 can include dopant materials therein (e.g., p-type or n-type dopants) or can be composed of a conductive silicide material. First and second conductive regions 12, 52 can each represent a portion of a silicon-on-insulator (SOI) structure, with a buried insulator 28 being positioned below or above each conductive region 12, 52. STI(s) 54 can be generally composed of an isolating material, including a dielectric material composed of the same substance as insulator 28 or a different electrically insulating material. STI(s) 54 can generally be distinguished from insulator 28 by being positioned laterally adjacent to first and second conductive regions 12, 52.

IC structure 10 can also include a second group of semiconductor fins (i.e., one or more semiconductor fins) positioned over and contacting second conductive region 52. Specifically, IC structure 10 can include a fourth semiconductor fin 56, a fifth semiconductor fin 58, and a sixth semiconductor fin 60. Fourth and fifth semiconductor fins 56, 58 can be positioned in contact with third gate 24, such that fourth and fifth semiconductor fins 56, 58 are electrically connected to vertical section 26 of third gate 24. Sixth semiconductor fin 60 can be positioned in contact with a fourth gate 62, laterally separated from gates 20, 22, 24, e.g., by insulator 28 (FIG. 2). Fourth gate 62 can be composed of the same material as first gate 20, second gate 22, third gate

24, and/or any other currently known or later developed type of gate material. A vertical section 26 of first gate 20 can be positioned over and in contact with second conductive region 52, such that vertical section 26 electrically connects second conductive region 52 to first gate 20. Two transistors including first and second semiconductor fins 14, 16 can make one inverter structure while two other transistors formed from fourth and fifth semiconductor fins 56, 58 can form another inverter structure.

Two additional transistors including third semiconductor fin 18 and sixth semiconductor fin 60 can function as access transistors during operation, such that IC structure 10 provides an SRAM cell when coupled to a voltage source. In an SRAM cell, additional contacts 66 can serve as or be coupled to a "word line" connection. A word line connection, including and/or electrically connected to additional contacts 66, can control whether semiconductor fin(s) 18, 60 in the form of access transistors are turned on or off. Additional contacts 66 can each be coupled to only one SRAM cell, or in alternative embodiments can be coupled to and shared between two or more adjacent SRAM cells. As is discussed further in FIG. 4, semiconductor fin(s) 18, 60 can each be electrically coupled to a respective contact 30 (FIG. 2) in the form of a bit line contact. A bit line contact can be selectively electrically connected to or disconnected from IC structure 10 based on whether semiconductor fin(s) 18, 60, in the form of access transistors, have been turned on or off by the flow of current from additional contacts 66 (e.g., in the form of word line connections). Each semiconductor fin 56, 58, 60 can be substantially vertically oriented relative to second conductive region 52. In an example embodiment, a vertical length to horizontal length aspect ratio of one or more semiconductor fins 56, 58, 60, can be, e.g., at least approximately two-to-one.

Figure 3:
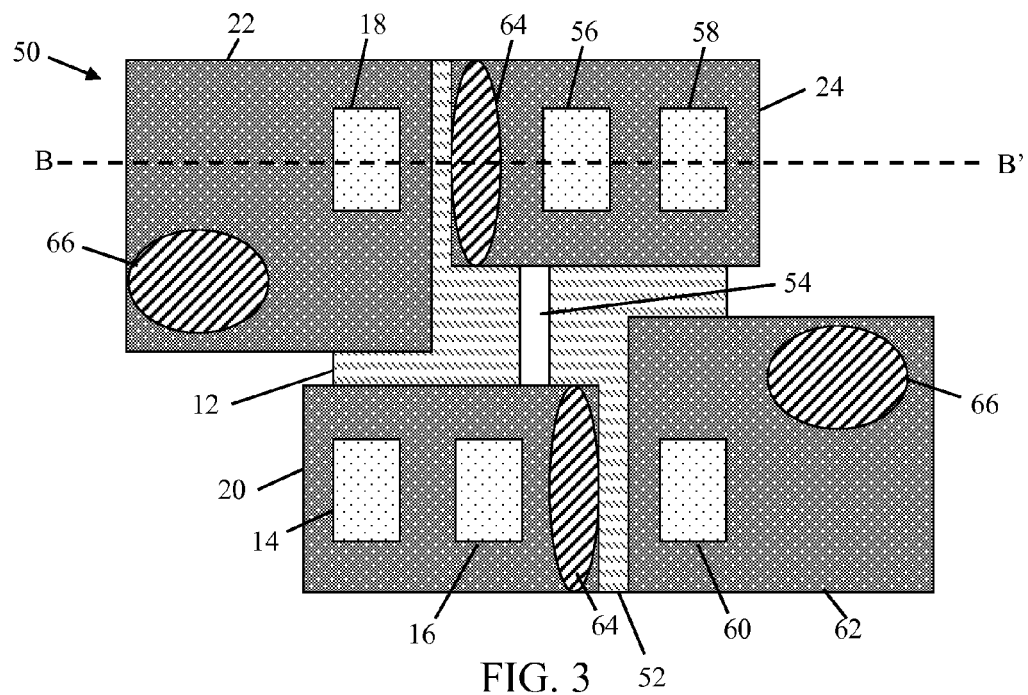
FIG. 3 shows a plan view of another IC structure according to embodiments of the present disclosure.

Turning to FIG. 3, another IC structure 50 according to embodiments of the present disclosure is shown. IC structure 50 may be provided in the same product as IC structure 10 (FIGS. 1, 2) can be embodied as or within a separate, independent device. As is discussed elsewhere herein, IC structure 50 can function as a complete SRAM cell during operation, e.g., when connected to other circuit components where applicable. IC structure 50 can include second conductive region 52 separated from first conductive region 12 and other semiconductor materials by STI. First and second conductive regions 12, 52 can each represent a portion of a silicon-on-insulator (SOI) structure, with a buried insulator 28 being positioned below or above each conductive region 12, 52.

IC structure 50 can also include a second group of semiconductor fins (e.g., one or more semiconductor fins) positioned over and contacting second conductive region 52. Specifically, IC structure 50 can include fourth semiconductor fin 56, fifth semiconductor fin 58, and/or sixth semiconductor fin 60. Fourth and fifth semiconductor fins 56, 58 can be positioned in contact with third gate 24. Sixth semiconductor fin 60 can be positioned in contact with fourth gate 62, laterally separated from gates 20, 22, 24, e.g., by insulator 28 (FIG. 2). In one respect, IC structure 50 can be distinguished from IC structure 10 by the application of contacts 64 for providing an electrical connection between a gate (e.g., first or third gates 20, 24) and an adjacent conductive region (e.g., first or second conductive regions 12, 52). Each contact 64 can be positioned over and in contact with first or second conductive region 12, 52, such that second contact 64 electrically connects one conductive region to one gate. Contacts 64 can be formed, e.g., by forming a trench to expose an upper surface of first and/or second conductive regions 12, 52, and forming a refractory liner material (not shown) upon exposed conductive region(s) 12, 52 and sidewalls of the trench. A metal can then be deposited upon the liner material, before being etched back to a desired size, e.g., by application of polishing techniques such as chemical mechanical polishing (CMP) or other processes for removal and/or planarization. Second contacts 64 can thus extend through gate(s) 20, 24 to reach other vertically separated circuit structures. During operation, the electrical coupling between gates and conductive regions through contact(s) 64 can create a cross-coupled inverter structure. More specifically, two transistors including first and second semiconductor fins 14, 16 can make one inverter structure while two other transistors formed from fourth and fifth semiconductor fins 56, 58 can form another inverter structure. Two additional transistors including third semiconductor fin 18 and sixth semiconductor fin 60 can function as access transistors during operation, such that IC structure 50 provides an SRAM cell when coupled to a voltage source, i.e., through contact(s) 64, and/or additional contacts 66. In an SRAM cell, additional contacts 66 can serve as or be coupled to a word line" connection. Semiconductor fin(s) 18, 60 can each be electrically coupled to a respective contact 30 (FIG. 4) in the form of a bit line contact.

Figure 4:
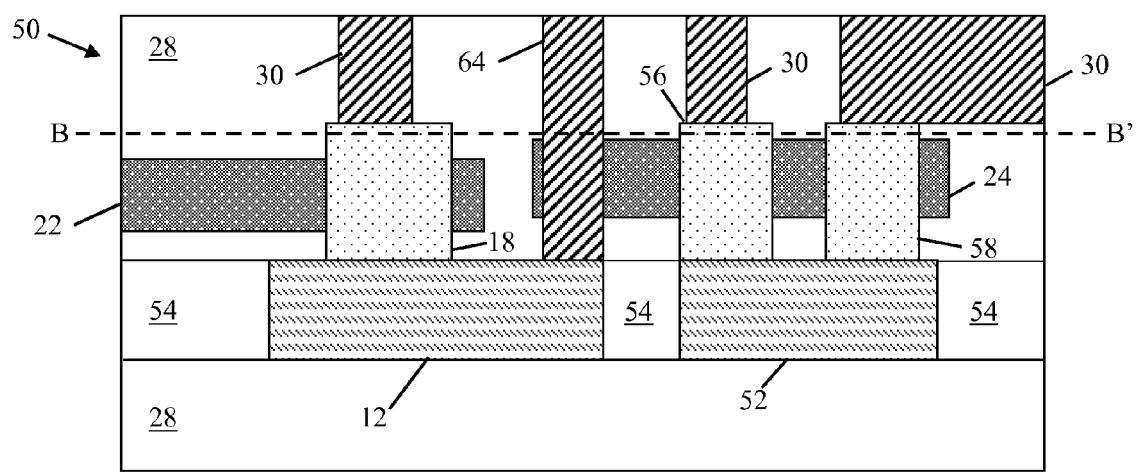
FIG. 4 shows a cross-sectional view along line B-B' of an IC structure according to embodiments of the present disclosure.

Referring to FIG. 4, a cross-sectional view of IC structure 50 along line B-B' of FIG. 3 is shown. Insulator 28 can be positioned above and below first and second conductive regions 12, 52, with STI(s) 54 being positioned laterally therebetween to provide electrical insulation between disconnected components. Insulator 28 below first conductive region 12, second conductive region 52, and STI(s) 54 can be a buried insulator layer or an SOI structure as discussed herein. IC structure 50 can also include additional contacts 30 positioned over and in contact with third semiconductor fin 18, fourth semiconductor fin 56, and fifth semiconductor fin 58. Where IC structure 50 functions as all or part of an SRAM cell during operation, contacts 30 in contact with third semiconductor fin 18 and sixth semiconductor fin 60 can be embodied as a "bit line" connection or an electrical coupling thereto. A bit line connection can be used to transfer data during read and/or write operations. During operation, transistors including third and sixth semiconductor fins 18, 60, their respective contacts 30, and conductive regions 12, 52, can be driven to high and/or low voltages by being selectively connected to cross-coupled inverters including semiconductor fins 14, 16, 56, 58.

Contacts can be connected to first, second, fourth, and fifth semiconductor fins 14, 16, 56, 58 to provide additional functions. In an embodiment, first and fifth semiconductor fins 14, 58 can be electrically connected to contacts 30 which are in turn connected to a source voltage (typically represented as $V_{ss}$), while second and fourth semiconductor fins can be electrically connected to contacts 30 which provide an electrical connection to a drain voltage (typically represented as $V_{dd}$). Each semiconductor fin 14, 16, 56, 58 in turn being connected to first or second conductive region 12, 52 can allow these semiconductor fins to function as cross-coupled inverters. The source and drain voltages, $V_{ss}$ and $V_{dd}$, can each be electrically biased during operation to govern reading and writing operations. For example, either $V_{ss}$ or $V_{dd}$ can be biased to a positive or negative voltage value, while the other voltage source can be biased to have a zero voltage or ground value, thereby directing the flow of current through the cross-coupled inverters of the cell in a desired direction through IC structure 50. Each contact 30 can be composed of the same material as other contacts 30 described herein, or can be in the form of a doped semiconductor layer or silicide material for providing an electrical connection. Contact(s) 30 can connect IC structure 50 to other voltage sources and/or electrical components (not shown) external to IC structure 50, with IC structure 50 acting as an SRAM structure or wholly contained SRAM cell during operation.

Figure 5:
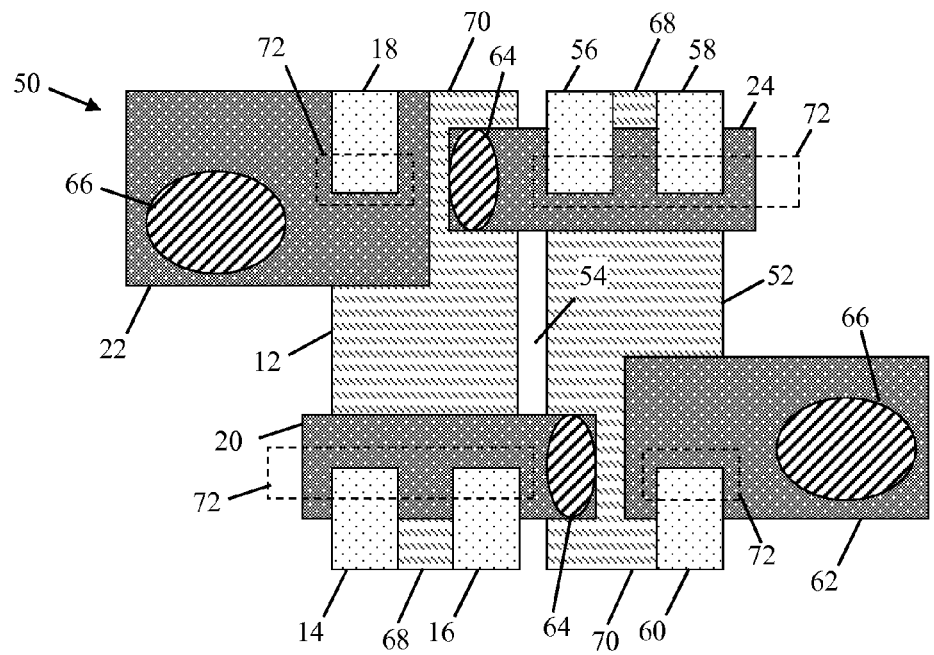
FIG. 5 shows a plan view of yet another IC structure according to embodiments of the present disclosure.

Referring to FIG. 5, an alternative embodiment of IC structure 50 according to the present disclosure is shown. First conductive region 12 and second conductive region 52 can each include a first perimeter edge 68 and a second perimeter edge 70. First perimeter edge 68 and second perimeter edge 70 can be positioned on different sides of first conductive region 12 and second conductive region 52. In an embodiment, first and second semiconductor fins 14, 16, can be substantially vertically aligned with first perimeter edge 68 of first conductive region 12, while third semiconductor fin 18 can be substantially vertically aligned with second perimeter edge 70 of first conductive region 12. Fourth and fifth semiconductor fins 56, 58, can be substantially vertically aligned with first perimeter edge 68 of second conductive region 52, while sixth semiconductor fin 60 can be substantially vertically aligned with second perimeter edge 70 of second conductive region 52. The substantial alignment between semiconductor fins 14, 16, 18, 56, 58, 60 and perimeter edges 68, 70 of conductive regions 12, 52 can cause gates 20, 22, 24, 62 to contact only one side of each semiconductor fin. In this embodiment, one or more gates 20, 22, 24, 64 substantially wrap around (i.e., only partially enclose) each semiconductor fin. For example, gates 20, 22, 24, 62 may not wrap completely around respective semiconductor fins, thereby laterally exposing at least one perimeter edge of semiconductor fin(s) 14, 16, 18, 56, 58, 60. To provide this configuration, each gate 20, 22, 24, 62 can include at least one notch 72 for receiving and contacting a region of semiconductor fin(s) 14, 16, 18, 56, 58, 60 therein. Among other things, the presence of notches 72 can provide for the substantial vertical alignment between semiconductor fin(s) 14, 16, 18, 56, 58, 60 and conductive region(s) 12, 52 to reduce the surface area of IC structure 50.

Figure 6:
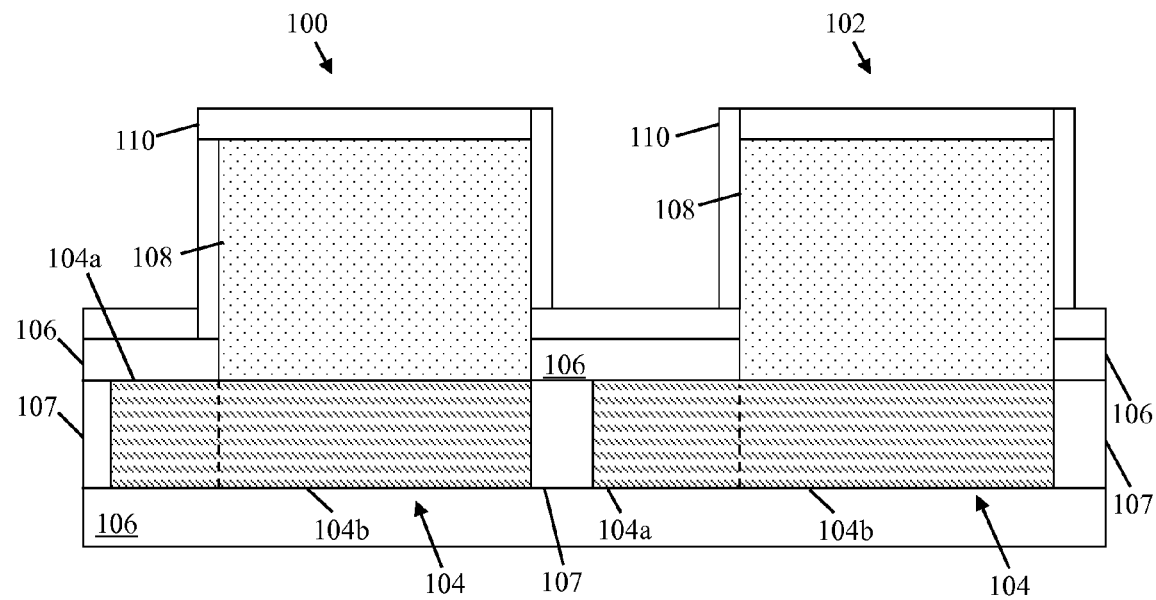
FIG. 6 shows a cross-sectional view of two IC structures to be electrically connected according to embodiments of the present disclosure.

Turning to FIG. 6, embodiments of the present disclosure can include methods of forming an electrical connection between two or more IC structures. In particular, connecting two or more IC structures to each other can allow IC structure(s) 10 (FIGS. 1, 2), 50 (FIGS. 2-5) described herein to be partially or completely formed. Methods of forming an electrical connection according to embodiments of the present disclosure can include providing a larger structure including two electrically separated first and second sub-structures 100, 102, which can be formed according to an independent and/or separate group of processing steps. Each sub-structure 100, 102 can include a conductive region 104, with an insulator 106 positioned over at least a first portion 104a of conductive region 104. A semiconductor fin 108 can be positioned vertically over a second portion 104b of conductive region 104, with a gate dielectric layer 110 being positioned over semiconductor fin 108 and insulator 106. Gate dielectric layer 110 can be in the form of a gate dielectric material, and thus can include silicon oxide ($SiO_2$), hafnium oxide ($HfO_2$), zirconium silicate ($ZrSiO_4$), and/or other types of dielectric materials described herein. Although first portion 104a is shown as being smaller relative to second portion 104b of conductive region 104, it is understood that first portion 104a can be the same size or larger than second portion 104b in alternative embodiments. Insulator 106 can be positioned horizontally between conductive regions 104 of each sub-structure 102 to electrically insulate conductive regions 104 from each other. Insulator 106 can be composed of one or more electrically insulating materials discussed elsewhere herein. In addition, conductive region(s) 104 can be laterally separated from each other through one or more shallow trench isolations 107 composed of the same material as STI(s) 54 (FIG. 4) or any other currently known or later developed electrically insulative material.

Figure 7:
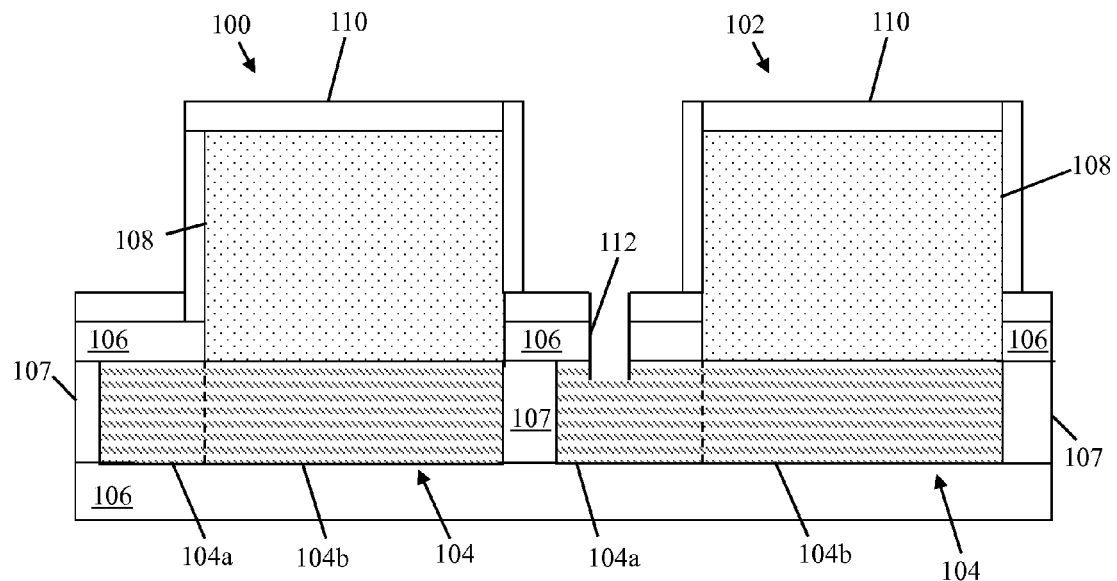
FIG. 7 shows a cross-sectional view of two IC structures and a trench according to embodiments of the present disclosure.

Turning to FIG. 7, embodiments of the present disclosure can include removing a portion of insulator 106 and gate dielectric layer 110 positioned over second portion 104a of second sub-structure 102 (shown by example as the right-most structure in FIG. 7). As used herein, the term "removing" can include any one of various material removal techniques now known or later developed, e.g., etching, wet etching, a reactive ion etch (RIE), etc. "RIE" or "reactive ion etch" refers to a variation of plasma etching in which, during etching, a semiconductor wafer is placed on an RF powered electrode. Throughout RIE, the wafer may take on an electric potential which accelerates the etching species extracted from plasma toward the etched surface. To determine a position from which materials are removed from sub-structure(s) 100, 102, a fabricator can form an inert or etchant resistive soft or hard mask (e.g., by deposition or any currently known or later developed process of forming or removing a material) to selectively expose regions of material to be removed. Portions of insulator 106 and gate dielectric layer 110 can be removed to form a trench 112 and expose first portion 104a of conductive region 104 in second sub-structure 102. Any currently known or later developed selective removal process, such as patterning with wet or dry etching, can be applied to form trench 112 and expose first portion 104a of conductive region 104 in second sub-structure 102. Patterning generally refers to the combined process of forming a mask upon a layer of material (e.g., by depositing a photoresist layer and/or other etch-resistant materials thereon) before removing portions of the material not covered by the photoresist layer and/or other resistant materials.

Figure 8:
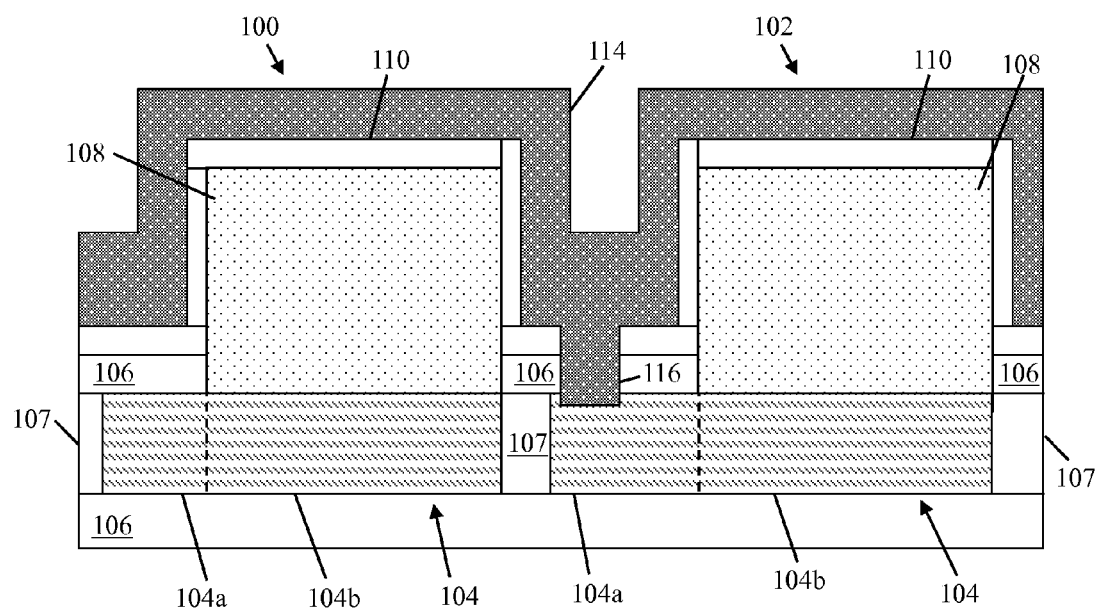
FIG. 8 shows a cross-sectional view of two IC structures and a first gate region according to embodiments of the present disclosure.

Referring now to FIG. 8, processes according to the present disclosure can include forming a gate material 114 within trench 112 and over first and second sub-structures 100, 102. Gate material 114 can be composed of one or more of the materials discussed herein with regard to first, second, third, and fourth gates 20, 22, 24, 62 (FIGS. 3-5), or can be composed of any other currently known or later developed conductive material for providing an electrical connection to a semiconductor fin. The formed gate material 114 can include a first gate region 116 positioned over and in contact with at least the exposed first portion 104a of conductive region 104 positioned within trench 112 (FIG. 7). First gate region 116 can generally be distinguished from the remainder of gate material 114 by being positioned within trench 112 (FIG. 7) thereby having a substantially vertical orientation. First gate region 116 can be composed of a similar material or the same material as gate material 114 in some embodiments, and more specifically can be formed during the same metallization process as the remainder of gate material 114. Gate material 114 with first gate region 116 can be formed pursuant to any currently known or later developed process of forming a material. For example, gate material 114 and first gate region 116 can be formed by deposition. As used herein, the terms "deposition" or "depositing" may include any now known or later developed technique appropriate for deposition, including but not limited to, for example: chemical vapor deposition (CVD), low-pressure CVD (LPCVD), plasma-enhanced CVD (PECVD), sub-atmospheric CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Figure 9:
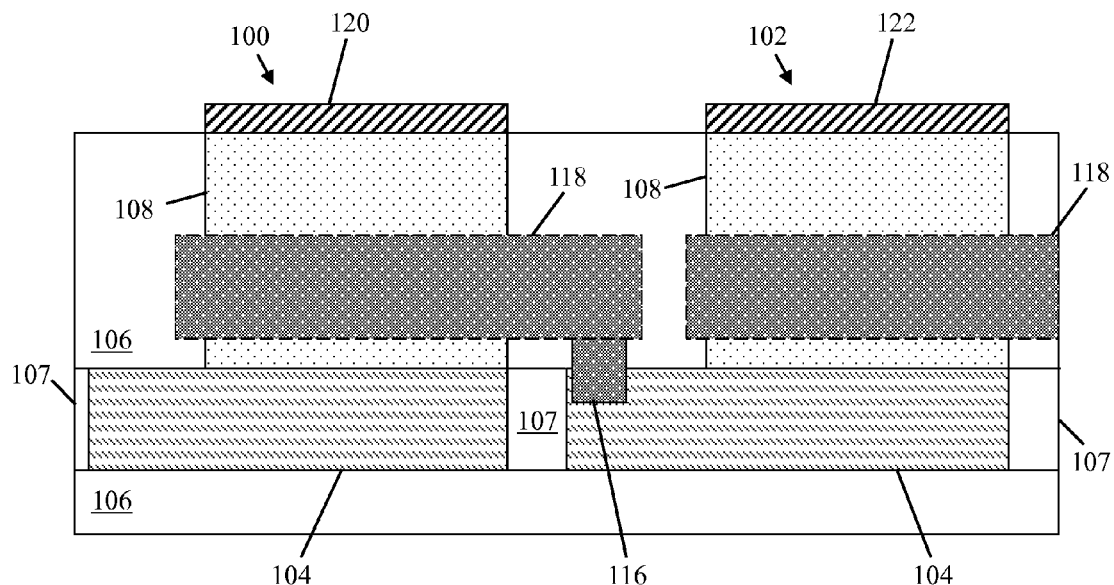
FIG. 9 shows a cross-sectional view of two electrically connected IC structures according to embodiments of the present disclosure.

Turning to FIG. 9, gate material 114 can include a second gate region 118 formed laterally adjacent to first gate region 116 and semiconductor fin 108 of second sub-structure 102, with a portion of gate dielectric 110 (FIGS. 6-8) being positioned therebetween. The forming of second gate region 118 can electrically connect conductive region 104 of first sub-structure 100 to gate dielectric 110 of semiconductor fin 108 in first sub-structure 100. In addition, embodiments of the present disclosure can optionally include forming another second gate region 118 laterally adjacent to semiconductor fin 108 of second sub-structure 102, e.g., during the same metallization process. Second gate regions 118 are shown in FIG. 9 with phantom lines to denote their position in a laterally displaced two-dimensional plane from first and second sub-structures 100, 102. To form second gate regions 118, a portion of material (e.g., a portion of a laterally positioned insulator 106) can be removed pursuant to any currently known or later developed process to expose an area laterally adjacent to first and sub-structures 100, 102. Second gate region(s) 118 can thereafter be formed in the removed portions and in contact with semiconductor fin(s) 108 and first gate region 116. Second gate region(s) 118 can contact gate dielectric layers 110 positioned upon and/or adjacent to semiconductor fin(s) 108 of first sub-structure 100 and second sub-structure 102. It is also understood that second gate regions 118 can at least partially be formed in the same two-dimensional plane as first and second sub-structures 100, 102 in alternative embodiments while remaining laterally adjacent to first gate region 116 and/or semiconductor fin(s) 108, e.g., by removing portions of insulator 106 and/or other materials positioned over or contacting the electrically connected structures.

FIG. 9 also illustrates processes for selectively removing portions of gate material 114 (FIG. 8), without removing first gate region 116, to form electrical connections between first and second sub-structures 100, 102 to other components. At least a portion of gate material 114 and gate dielectric layer 110 (FIGS. 6-8) positioned over first and second sub-structures 100, 102 can be removed with first gate region 116 remaining intact within trench 112, over and/or alongside semiconductor fins 108. Gate material 114 and gate dielectric layer 110 can each be removed by any currently known or later developed removal process (e.g., dry etching, wet etching, and/or planarization). Additional insulating material can be formed over insulator 106 to expand the volume of insulator 106, thereby causing an upper surface of semiconductor fins 108 to be substantially coplanar with an upper surface of insulator(s) 106. A first contact 120 can be formed over semiconductor fin 108 of first sub-structure 100 and a second contact 122 can be formed over semiconductor fin 108 of second sub-structure 102. First and second contacts 120, 122 can be formed of a conductive metal, such as one or more of the materials discussed herein with respect to contacts 30 (FIGS. 3-5), 64 (FIGS. 3, 5). First and second contacts 120, 122 can be formed, e.g., by forming a trench to expose an upper surface of semiconductor fin(s) 108, and forming a refractory liner material (not shown) upon the exposed semiconductor fin(s) 108 and sidewalls of the trench. A metal can be deposited upon the liner material, before being etched back to a desired size, e.g., by application of polishing techniques such as CMP or other processes for removal and/or planarization. It is understood that any other type of contact discussed herein (e.g., contacts 30 (FIGS. 2, 4), contacts 64 (FIGS. 3-5), and additional contacts 66 (FIGS. 3, 5) can be formed pursuant to the same combination of process steps. The electrically connected sub-structures 100, 102 can each form a portion of a respective vertically-oriented FET, such as a vertical FinFET, with gate regions 116, 118 functioning as gates and semiconductor fins 108 each functioning as a source/drain electrical connection and channel region during operation. In addition, each semiconductor fin 108 of first and second sub-structures 100, 102 can be substantially vertically aligned with a perimeter edge of conductive region 104, e.g., according to the configuration shown in FIG. 5 and discussed elsewhere herein.

Figure 10:
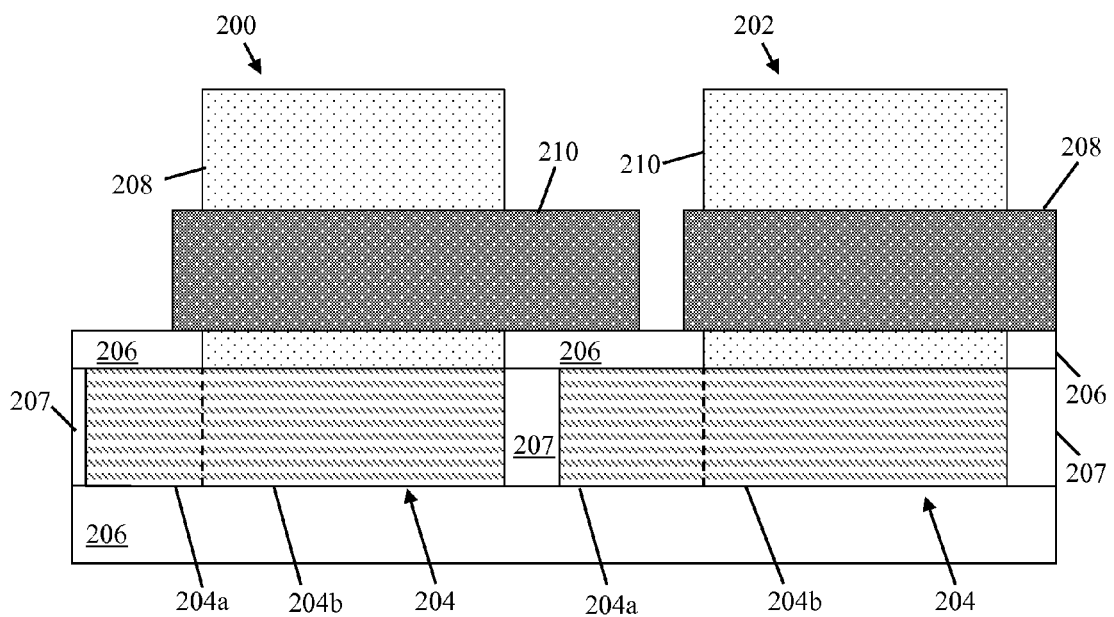
FIG. 10 shows a cross-sectional view of two IC structures to be electrically connected according to embodiments of the present disclosure.

Turning to FIG. 10, a first sub-structure 200 and a second sub-structure 202 can be formed in a shared region of IC precursor material(s) including a conductive region 204. Sub-structures 200, 202 shown in FIG. 10 and described herein can be independently fabricated in a separate and/or independent group of processes. Embodiments of the present disclosure can electrically connect first sub-structure 200 to second sub-structure 202 as described herein to form, e.g., a group of electrically connected FinFET transistors and/or a RAM cell. Each sub-structure 200, 202 can include conductive region 204 positioned between two or more regions of an insulator 206, with a semiconductor fin 208 positioned substantially vertically over a first portion 204a of conductive region 204. A gate 210 can be electrically connected to semiconductor fin 208, e.g., directly or through a gate dielectric layer (not shown), such that a portion of gate 210 of sub-structure 202 is positioned vertically over a second portion 204b of conductive region 204 in first sub-structure 200. Conductive region(s) 204 can be laterally separated from each other through one or more shallow trench isolations 207 composed of the same material as STI(s) 54 (FIG. 4) or any other currently known or later developed electrically insulative material. Initially, gate 210 of second sub-structure 202 can be electrically isolated from conductive region 204 of first sub-structure 200. Each semiconductor fin 208 of first and second sub-structures 200, 202 can be substantially vertically aligned with a perimeter edge of a corresponding conductive region 204, e.g., according to the configuration shown in FIG. 5 and discussed elsewhere herein.

Figure 11:
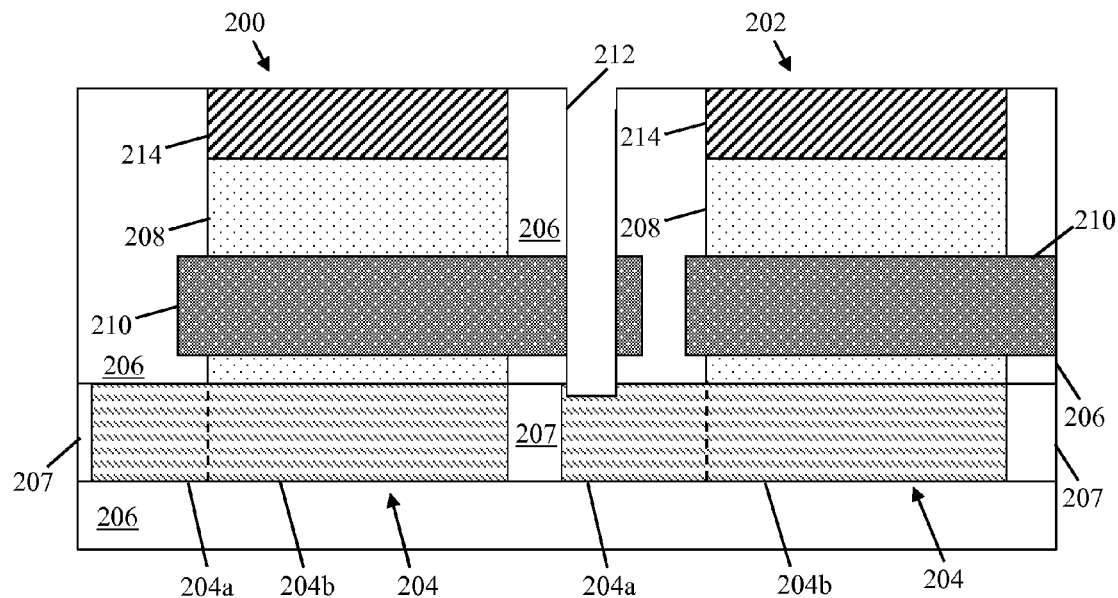
FIG. 11 shows a cross-sectional view of two IC structures and a trench according to embodiments of the present disclosure.

Turning to FIG. 11, processes according to the present disclosure can include removing a portion of insulator 206 and gate 210 of first sub-structure 202 to form a trench 212. The forming of trench 212 can also expose first portion 204a of conductive region 204 of second sub-structure 200. Any currently known or later developed process of selective or non-selective removal, e.g., patterning, dry etching, wet etching, and/or one or more of the removal processes discussed elsewhere herein, can allow partial removal of insulator 206. The two-dimensional plane shown in FIG. 11 can be the same plane as that shown in FIG. 10 or a different two dimensional plane, and the etched surface area can only partially include gate 210 of first sub-structure 202, e.g., such that only a single perimeter edge of gate 210 of first sub-structure 202 is removed. In any event, at least one sidewall of trench 212 can include a region adjacent to gate 210, and a lower surface of gate 212 can expose conductive region 204. The forming of trench 212 can leave STIs 207 intact, such that conductive regions 204 of each sub-structure 200, 202 remain electrically disconnected from each other.

Figure 12:
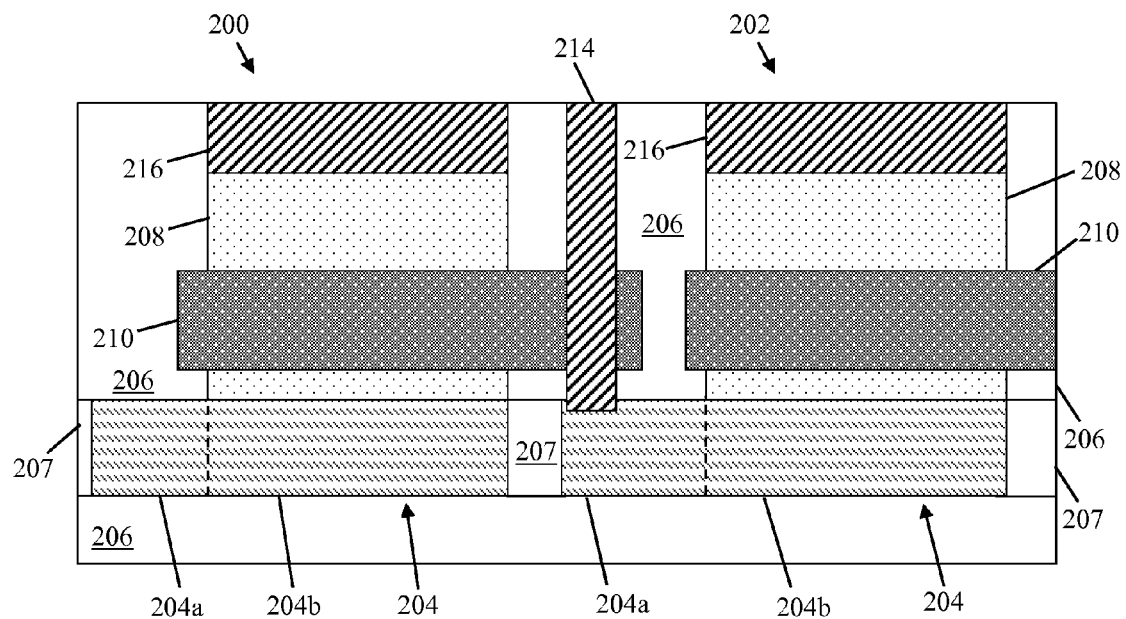
FIG. 12 shows a cross-sectional view of two electrically connected IC structures according to embodiments of the present disclosure.

Referring now to FIG. 12, embodiments of the present disclosure can include forming a connecting contact 214 within trench 212 (FIG. 11), over the exposed first portion 204a of conductive region 204 in second sub-structure 202. Connecting contact 214 can electrically connect gate 210 in first sub-structure 200 to conductive region 204 in second sub-structure 202, e.g., by connecting contact 214 being composed of one or more of the example electrically conductive materials described herein. In the same process or an independent process, contacts 216 can be formed over semiconductor fins 208 of first and second sub-structures 200, 202. Contacts 216 can provide an electrical connection to the structure of semiconductor fins 208, thereby allowing each sub-structure 200, 202 to function as a vertically oriented FinFET transistor, with channel formation in semiconductor fins 208 being controlled by the electrical properties of each gate 210.

Connecting contact 214 and/or source drain contacts 216 can be formed, e.g., by forming a trench (e.g., trench 212 (FIG. 11)) to expose an upper surface of conductive region 204 and/or semiconductor fin(s) 108, and forming a refractory liner material (not shown) upon the exposed material and sidewalls of the trench (e.g., trench 212). A conductive metal can then be deposited upon the liner material, before being etched back to provide a desired size, e.g., by application of polishing techniques such as CMP or other processes for removal and/or planarization. To use sub-structures 200 and/or 202 as FinFET transistors, contacts 216 can be electrically connected to a voltage source, such that electrical currents can flow through semiconductor fin(s) 208 in response to channels being formed from an applied voltage of gate(s) 210. Connecting contact 214 and/or contacts 216 can be composed of the same material as contacts 30 (FIGS. 2, 4) contacts 64 (FIGS. 3-5), and/or additional contacts 66 (FIGS. 3, 5). Processes of forming contact 214 and/or contacts 216 can include one or more of the example processes of forming a material discussed elsewhere herein relative to structures formed in other process steps.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure comprising:
a first conductive region;
a second conductive region laterally separated from the first conductive region;
a first vertically-oriented semiconductor fin formed over and contacting the first conductive region;
a second vertically-oriented semiconductor fin formed over and contacting the second conductive region;
a first gate contacting each of the first vertically-oriented semiconductor fin and the second conductive region, wherein the first gate includes:
a substantially horizontal section contacting the first vertically-oriented semiconductor fin, and
a substantially vertical section contacting the second conductive region; and
a second gate contacting each of the second vertically-oriented semiconductor fin and the first conductive region, wherein the second gate includes:
a substantially horizontal section contacting the second vertically-oriented semiconductor fin, and
a substantially vertical section contacting the first conductive region.

2. The IC structure of claim 1, further comprising:
a third vertically-oriented semiconductor fin formed over and contacting the first conductive region, and electrically connected to the first gate;
a fourth vertically-oriented semiconductor fin formed over and contacting the first conductive region;
a fifth vertically-oriented semiconductor fin formed over and contacting the second conductive region, and electrically connected to the second gate; and
a sixth vertically-oriented semiconductor fin formed over and contacting the second conductive region, wherein the first, second, third, fourth, fifth, and sixth vertically-oriented semiconductor fins comprise portions of respective FinFET transistors of a static random access memory (SRAM) cell.

3. The IC structure of claim 1, wherein a vertical length to horizontal length aspect ratio of one of the first semiconductor fin and the second semiconductor fin is at least approximately two-to-one.

4. The IC structure of claim 1, wherein a perimeter edge of the first vertically-oriented semiconductor fin is substantially vertically aligned with a perimeter edge of the first conductive region, and wherein a perimeter edge of the second vertically-oriented semiconductor fin is substantially vertically aligned with a perimeter edge of the second conductive region.

5. The IC structure of claim 1, wherein the first gate substantially wraps around at least one of the first semiconductor fin and the second semiconductor fin.

6. The IC structure of claim 1, wherein at least one of the first conductive region and the second conductive region comprises one of a p-doped semiconductor region, an n-doped semiconductor region, and a silicide region.

7. The IC structure of claim 1, wherein the first conductive region and the second conductive region each comprise a doped semiconductor layer of a silicon-on-insulator (SOI) structure.

8. An integrated circuit (IC) structure comprising:
a first conductive region;
a second conductive region laterally separated from the first conductive region;

a first vertically-oriented semiconductor fin formed over and contacting the first conductive region;
a second vertically-oriented semiconductor fin formed over and contacting the second conductive region; and
a first gate contacting the first vertically-oriented semiconductor fin; and
a first contact positioned over the second conductive region and extending vertically through the first gate, wherein the first contact electrically connects the first gate to the second conductive region.

9. The IC structure of claim 8, further comprising:
a second gate contacting the second vertically-oriented semiconductor fin; and
a second contact positioned over the first conductive region and extending vertically through each of the insulator and the first gate, wherein the first contact electrically connects the second gate to the first conductive region.

10. The IC structure of claim 9, further comprising:
a third vertically-oriented semiconductor fin formed over and contacting the first conductive region, and electrically connected to the first gate;
a fourth vertically-oriented semiconductor fin formed over and contacting the first conductive region;
a fifth vertically-oriented semiconductor fin formed over and contacting the second conductive region, and electrically connected to the second gate; and
a sixth vertically-oriented semiconductor fin formed over and contacting the second conductive region, wherein the first, second, third, fourth, fifth, and sixth vertically-oriented semiconductor fins comprise portions of respective FinFET transistors of a static random access memory (SRAM) cell.

11. The IC structure of claim 8, wherein a vertical length to horizontal length aspect ratio of one of the first semiconductor fin and the second semiconductor fin is at least approximately two-to-one.

12. The IC structure of claim 8, wherein a perimeter edge of the first vertically-oriented semiconductor fin is substantially vertically aligned with a perimeter edge of the first conductive region, and wherein a perimeter edge of the second vertically-oriented semiconductor fin is substantially vertically aligned with a perimeter edge of the second conductive region.

13. The IC structure of claim 8, wherein the first gate substantially wraps around at least one of the first semiconductor fin and the second semiconductor fin.

14. The IC structure of claim 8, wherein at least one of the first conductive region and the second conductive region comprises one of a p-doped semiconductor region, an n-doped semiconductor region, and a silicide region.

15. The IC structure of claim 8, wherein the first conductive region and the second conductive region each comprise a doped semiconductor layer of a silicon-on-insulator (SOI) structure.

16. An integrated circuit (IC) structure comprising:
a first conductive region;
a second conductive region laterally separated from the first conductive region;
a first vertically-oriented semiconductor fin formed over and contacting the first conductive region;
a second vertically-oriented semiconductor fin formed over and contacting the second conductive region, wherein a vertical length to horizontal length aspect ratio of one of the first vertically-oriented semiconductor fin and the second vertically-oriented semiconductor fin is at least approximately two-to-one; and
a first gate contacting each of the first vertically-oriented semiconductor fin and the second conductive region, wherein the first gate includes:
a substantially horizontal section contacting the first vertically-oriented semiconductor fin, and
a substantially vertical section contacting the second conductive region.

17. The IC structure of claim 16, further comprising a second gate contacting each of the second vertically-oriented semiconductor fin and the first conductive region, wherein the second gate includes:
a substantially horizontal section contacting the second vertically-oriented semiconductor fin, and
a substantially vertical section contacting the first conductive region.

18. The IC structure of claim 16, wherein a perimeter edge of the first vertically-oriented semiconductor fin is substantially vertically aligned with a perimeter edge of the first conductive region, and wherein a perimeter edge of the second vertically-oriented semiconductor fin is substantially vertically aligned with a perimeter edge of the second conductive region.

19. The IC structure of claim 16, wherein the first gate substantially wraps around at least one of the first semiconductor fin and the second semiconductor fin.

* * * * *